(12) United States Patent
Gada

(10) Patent No.: US 12,408,284 B1
(45) Date of Patent: Sep. 2, 2025

(54) ENCLOSURE WITH GEL-SEALED PERIMETER AND CABLE LOCKING MECHANISMS FOR INSULATION PIERCING CONNECTOR

(71) Applicant: Oriental Export Corporation, Mumbai (IN)

(72) Inventor: Sanjit Gada, Mumbai (IN)

( * ) Notice: Subject to any disclaimer, the term of this patent is extended or adjusted under 35 U.S.C. 154(b) by 0 days.

(21) Appl. No.: 19/074,346

(22) Filed: Mar. 8, 2025

(51) Int. Cl.
*H05K 5/06* (2006.01)
*H01R 4/2445* (2018.01)
*H05K 5/02* (2006.01)

(52) U.S. Cl.
CPC ........... *H05K 5/061* (2013.01); *H01R 4/2445* (2013.01); *H05K 5/0221* (2013.01); *H05K 5/069* (2013.01)

(58) Field of Classification Search
CPC ...... H05K 5/061; H05K 5/0221; H05K 5/069; H01R 4/2445
See application file for complete search history.

(56) References Cited

FOREIGN PATENT DOCUMENTS

| CN | 113270782 A | * | 8/2021 | ............. H01R 11/11 |
| CN | 112805880 B | * | 11/2022 | ......... H01R 13/5213 |

* cited by examiner

*Primary Examiner* — Jean F Duverne
(74) *Attorney, Agent, or Firm* — Alexander Postnikov

(57) ABSTRACT

Disclosed is an enclosure (100) for insulation piercing connector (306). The enclosure (100) includes a first cover portion (202) and a second cover portion (206), designed to provide environmental barrier for insulation piercing connectors (IPC). The first cover portion (202) features a first inner surface (202a) with a peripheral groove (202b) extending along its edges and a clamping structure (204) on the inner surface, which securely holds multiple cables (304a-304n) connected via the IPC (306). The second cover portion (206), hingedly connected to the first, includes a second inner surface (206a) with a matching peripheral groove (206b) along its edges. The first and second peripheral grooves (202b, 206b) are configured to accommodate a gel sealant (302) that forms watertight environmental barrier around the enclosure (100), protecting the IPC and associated cables from contaminants and environmental stressors. This design ensures durability, reliability, and effective protection for electrical connections in outdoor settings.

9 Claims, 4 Drawing Sheets

ENCLOSURE WITH GEL-SEALED PERIMETER AND CABLE LOCKING MECHANISMS FOR INSULATION PIERCING CONNECTOR

TECHNICAL FIELD

The present invention relates to the field of electrical connections, specifically to a durable and efficient enclosure with gel-sealed perimeter and cable locking mechanisms for insulation piercing connector. This invention addresses environmental protection, ease of installation, and enhanced durability for electrical connections exposed to outdoor conditions.

BACKGROUND

In solar installations, ensuring the reliability and longevity of electrical connections is paramount, especially given their exposure to harsh environmental conditions such as extreme temperatures, moisture, dust, and debris. Traditional connector designs often fall short in providing adequate protection against these challenges. They frequently rely on intricate assembly processes and fail to offer robust environmental sealing, which can compromise the system's performance and lead to costly maintenance or failure over time. In solar installations, the integrity of electrical connections is vital for maintaining system performance and reliability.

These installations are typically exposed to harsh environmental conditions such as UV radiation, temperature fluctuations, moisture, dust, and other contaminants. Existing connector designs often fall short of providing adequate protection against these challenges. Additionally, they frequently require complex assembly processes that increase installation time and risk of errors.

A persistent issue with conventional designs is the absence of a dependable barrier to shield electrical connections from contaminants and environmental exposure. Furthermore, inadequate cable locking mechanisms allow for movement and stress on the connections, increasing the risk of wear, damage, and disconnection. Many existing solutions also lack structural reinforcement, making them vulnerable to damage during installation or operation under demanding outdoor conditions.

There are various solutions that are available to solve the aforementioned problems. However, traditional solutions are prone to issues such as inadequate sealing mechanisms, leading to moisture ingress and contamination, lack of robust structural design, resulting in degradation under environmental stresses, inefficient cable locking mechanisms, and causing displacement or stress on connections over time. These shortcomings compromise system reliability, increase maintenance requirements, and reduce the lifespan of solar installations. To overcome these challenges, a more effective and durable solution is needed.

Thus, there remains a need to provide a solution to the installation problems existing in the prior art.

SUMMARY

The present invention relates to a robust connector cover system designed for solar installations. It features a gel-sealed perimeter to create a watertight environmental barrier without direct contact with the connector, effectively protecting it from contaminants. The system also includes a cable-locking mechanism that holds cables securely, preventing displacement and simplifying installation. Additionally, the cover's reinforced top enhances its durability, enabling it to withstand environmental challenges such as UV exposure, temperature fluctuations, and physical impacts. Together, these features ensure long-term reliability, ease of use, and efficiency in outdoor solar installations.

This innovative design addresses the limitations of traditional connectors by simplifying installation, reducing maintenance, and enhancing environmental resilience, making it an ideal solution for large-scale solar deployments. Key features include the gel-sealed perimeter for contaminant protection, the cable locking mechanism for stability, and the reinforced top for enhanced structural integrity.

In view of the foregoing, an enclosure for an insulation piercing connector (IPC) is provided, featuring a robust design tailored for secure cable connections and environmental protection. The enclosure comprises two primary components: a first cover portion and a second cover portion, which are designed to work in unison to safeguard the IPC and connected cables.

The present invention provides a durable and efficient connector cover system specifically designed for solar installations. This innovative system incorporates:

1. Gel-Sealed Perimeter: The cover includes a perimeter designed for the application of gel, forming a watertight environmental barrier around the connection. This design prevents contaminants from entering while avoiding direct contact between the gel and the connector.

2. Cable Locking Mechanism: A robust locking system securely holds the cable in place, preventing displacement and ensuring stability over time. The mechanism also facilitates easy placement of the connector, simplifying installation.

3. Reinforced Top Section: The cover features structural reinforcements at the top, enabling it to withstand rigorous durability tests and environmental stresses such as UV exposure, physical impacts, and temperature variations.

This connector cover system ensures long-term reliability, enhances performance, and simplifies installation, making it an ideal solution for solar installations exposed to challenging outdoor conditions.

In some embodiments of the present disclosure, the first cover portion includes a first inner surface and a first peripheral groove positioned along its periphery. This groove is specifically designed to accommodate a gel sealant, which creates an environmental barrier to protect the interior of the enclosure. Additionally, a clamping structure is integrated into the first inner surface, enabling the secure fastening of multiple cables connected through the IPC.

In some embodiments of the present disclosure, the second cover portion is hingedly coupled to the first cover portion, ensuring ease of operation. This second portion features a second inner surface and a second peripheral groove, which aligns with the groove on the first cover portion. Together, these grooves hold the gel sealant that forms an effective seal around the enclosure, providing superior protection against contaminants and environmental factors.

In some embodiments of the present disclosure, the enclosure is designed to operate in two positions: an open position and a closed position. In the open position, the first and second cover portions form a non-zero angle, facilitating easy access to the IPC and cables. In the closed position, the two portions align perfectly, and the gel sealant establishes the environmental barrier, ensuring optimal protection.

In some embodiments of the present disclosure, a series of clamps are incorporated within the first inner surface to hold subsidiary cables securely. This feature enhances the enclosure's utility by accommodating additional cables in a stable and organized manner, ensuring reliable connectivity.

In some embodiments of the present disclosure, the enclosure also includes sunken regions within both cover portions. These sunken regions are specifically designed to seat the IPC securely, minimizing movement and ensuring stability during operation. This design simplifies installation while enhancing the durability of the connection.

In some embodiments of the present disclosure, to further facilitate cable management, the first and second cover portions are equipped with sleeves. These sleeves guide the cables during insertion and ensure their proper alignment within the enclosure when it is in the closed position. This feature enhances the ease of installation and reduces the risk of errors.

In some embodiments of the present disclosure, the enclosure's design incorporates a unique contactless mechanism between the IPC and the gel sealant. By creating a gap between the two, the gel sealant provides environmental protection without direct contact, ensuring the integrity and functionality of the IPC.

In some embodiments of the present disclosure, a plurality of locking elements is integrated into the enclosure to secure the first and second cover portions in the closed position. These locking elements ensure a firm and stable connection, preventing accidental opening and maintaining the environmental barrier provided by the gel sealant.

In some embodiments of the present disclosure, the outer surfaces of both cover portions are reinforced with structural elements, enhancing the enclosure's durability and resistance to environmental stresses. This feature ensures the enclosure can withstand harsh conditions, including UV exposure, temperature fluctuations, and physical impacts.

In some embodiments of the present disclosure, the gel sealant used in the enclosure can be selected from various materials, including silicone-based, polyurethane, epoxy, or acrylic gel sealants. This versatility allows the enclosure to be tailored to specific environmental requirements and operational conditions.

In some embodiments of the present disclosure, the enclosure is designed to be reusable, making it a sustainable and cost-effective solution for long-term applications. Its monolithic structure further enhances its robustness and reliability, ensuring consistent performance over time.

In some embodiments of the present disclosure, the clamping structure within the enclosure is designed to accommodate cables with diameters ranging from 35 millimetres (mm) to 40 mm. This specification ensures compatibility with a wide range of cable sizes, making the enclosure suitable for diverse applications.

The present invention offers significant technical advancements over existing IPC enclosures, addressing shortcomings in reusability, ease of installation, and comprehensive environmental protection. The features like reusability, single-piece design, and all-sides gel sealing contribute to its novelty and non-obviousness, making it a substantial improvement over conventional solution.

Reusability Feature: Unlike existing solutions, the enclosure allows for easy opening and re-closing due to its hinged, two-part design, ensuring that it can be reused multiple times without degradation of its sealing properties. Existing enclosures are often single-use due to permanent sealing mechanisms like adhesive tapes or non-replaceable components. The hinge and gel sealant design make the invention non-obvious and reusable. The reusability reduces maintenance and replacement costs while ensuring prolonged environmental protection over the lifecycle of the IPC.

Single-Piece Design Feature: The enclosure's two cover portions are hingedly coupled, forming a single-piece structure that eliminates the need for separate fastening mechanisms. Conventional IPC enclosures often require multiple components like screws or additional fasteners. The single-piece, hinged design simplifies installation and reduces assembly time, making it a non-obvious improvement. The single-piece design enhances ease of use and minimizes the risk of misalignment or incomplete assembly, improving operational efficiency and reliability.

All-Sides Gel Coverage: The gel sealant is applied within peripheral grooves of both covers, creating a 360-degree environmental barrier around the IPC and cables.

This provides complete protection against moisture, dust, and other contaminants. Existing IPC enclosures often rely on partial sealing methods or single-sided gaskets, which may leave gaps for environmental ingress. The all-sides gel application is a non-obvious solution for achieving superior insulation. This feature significantly enhances the durability and performance of the IPC in harsh environments, reducing failures caused by environmental exposure.

BRIEF DESCRIPTION OF DRAWINGS

The above and still further features and advantages of aspects of the present disclosure becomes apparent upon consideration of the following detailed description of aspects thereof, especially when taken in conjunction with the accompanying drawings, and wherein.

To facilitate understanding, like reference numerals have been used, where possible, to designate like elements common to the figures.

DETAILED DESCRIPTION

Figure 1A:
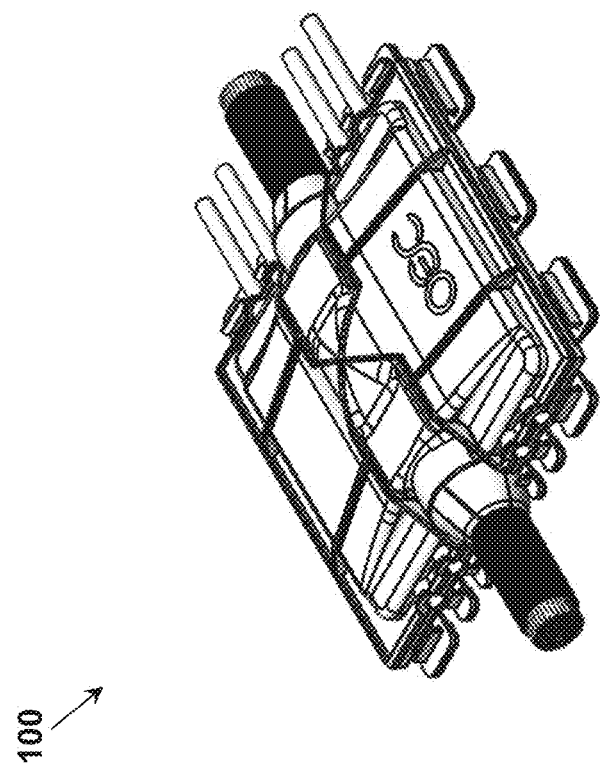
FIG. 1A illustrates a perspective view of an enclosure when the enclosure exhibits a closed position, in accordance with an embodiment of the present disclosure.

Various aspects of the present disclosure provide an enclosure for insulation piercing connector. The following description provides specific details of certain aspects of the disclosure illustrated in the drawings to provide a thorough understanding of those aspects. It should be recognized, however, that the present disclosure can be reflected in additional aspects and the disclosure may be practiced without some of the details in the following description.

The various aspects including the example aspects are now described more fully with reference to the accompanying drawings, in which the various aspects of the disclosure are shown. The disclosure may, however, be embodied in different forms and should not be construed as limited to the aspects set forth herein. Rather, these aspects are provided so that this disclosure is thorough and complete, and fully conveys the scope of the disclosure to those skilled in the art. In the drawings, the sizes of components may be exaggerated for clarity.

It is understood that when an element or layer is referred to as being "on," "connected to," or "coupled to" another element or layer, it can be directly on, connected to, or coupled to the other element or layer or intervening elements or layers that may be present. As used herein, the term "and/or" includes any and all combinations of one or more of the associated listed items.

The subject matter of example aspects, as disclosed herein, is described with specificity to meet statutory requirements. However, the description itself is not intended to limit the scope of this disclosure. Rather, the inventor/inventors have contemplated that the claimed subject matter might also be embodied in other ways, to include different features or combinations of features similar to the ones described in this document, in conjunction with other technologies. Generally, the various aspects including the example aspects relate to an enclosure for insulation piercing connector.

The present invention introduces a robust and efficient connector cover system specifically engineered for solar installations. This advanced system addresses the challenges posed by outdoor environments while ensuring durability, ease of use, and reliable protection of electrical connections.

One key feature of the invention is its gel-sealed perimeter. This innovative design incorporates a perimeter around the cover that is specifically intended for gel application. The gel creates a watertight environmental barrier, effectively shielding the connection from contaminants such as dust, moisture, and other harmful elements. Importantly, the gel sealant is applied in a manner that avoids direct contact with the connector, ensuring that the conductive elements remain unobstructed and free from interference.

Another essential component of this system is the cable locking mechanism, which provides a secure hold on the cable to prevent displacement over time. This locking mechanism ensures the stability and reliability of the connection, even in harsh conditions. Additionally, the design facilitates the straightforward placement of the connector within the cover, significantly simplifying the installation process and reducing the time and effort required for setup.

The cover also features a reinforced top section, which is built to withstand various environmental stresses. The structural enhancements ensure that the cover can endure rigorous durability tests and perform reliably under conditions such as prolonged UV exposure, physical impacts, and extreme temperature fluctuations. These reinforcements contribute to the system's longevity, making it well-suited for demanding solar installation applications.

Overall, this connector cover system offers a combination of long-term reliability, enhanced performance, and user-friendly design. By integrating a gel-sealed barrier, a secure cable-locking mechanism, and structural reinforcements, the invention provides a comprehensive solution for protecting electrical connections in outdoor solar environments. Its durability and efficiency make it an indispensable component in modern solar installations exposed to challenging environmental conditions.

Figure 1B:
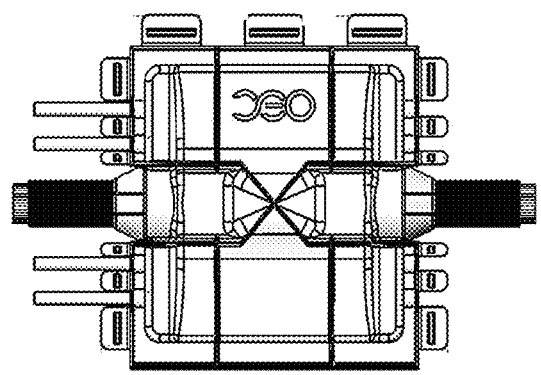
FIG. 1B illustrates a top view of the enclosure of FIG. 1A when the enclosure exhibits the closed position, in accordance with an embodiment of the present disclosure.

FIG. 1A illustrates a perspective view of an enclosure 100 when the enclosure 100 exhibits a closed position, in accordance with an embodiment of the present disclosure. FIG. 1B illustrates a top view of the enclosure 100 of FIG. 1A when the enclosure 100 exhibits the closed position, in accordance with an embodiment of the present disclosure.

The enclosure 100 may be adapted for insulation piercing connector (IPC). The enclosure 100 may be a reusable enclosure. The enclosure 100 may facilitate to resolve these shortcomings by introducing an innovative connector cover that combines simplicity and durability. The design features a perimeter for gel application, creating an effective environmental seal without requiring direct contact with the connector itself. This protects the electrical connection from contaminants while ensuring easy maintenance. Additionally, the cover includes a locking mechanism to secure the cable in place, preventing movement and stress on the connections. A reinforced top section enhances the cover's durability, allowing it to withstand rigorous outdoor durability tests and extreme conditions. By simplifying the installation process and offering superior protection and reliability, this invention addresses critical challenges in solar installations and enhances the overall performance and longevity of electrical connections. The enclosure 100 may exhibit a monolithic structure. In other words, various components of the enclosure 100 may be integral to facilitate the monolithic structure of the enclosure 100.

In some embodiments of the present disclosure, the enclosure 100 may include a length that may be in a range of 350 millimetres (mm) to 400 mm. Preferably, the enclosure 100 may include the length that may be 355 mm.

In some embodiments of the present disclosure, the enclosure 100 may include a width that may be in a range of 65 mm to 70 mm. Preferably, the enclosure 100 may include the width that may be 68.58 mm.

Figure 2A:
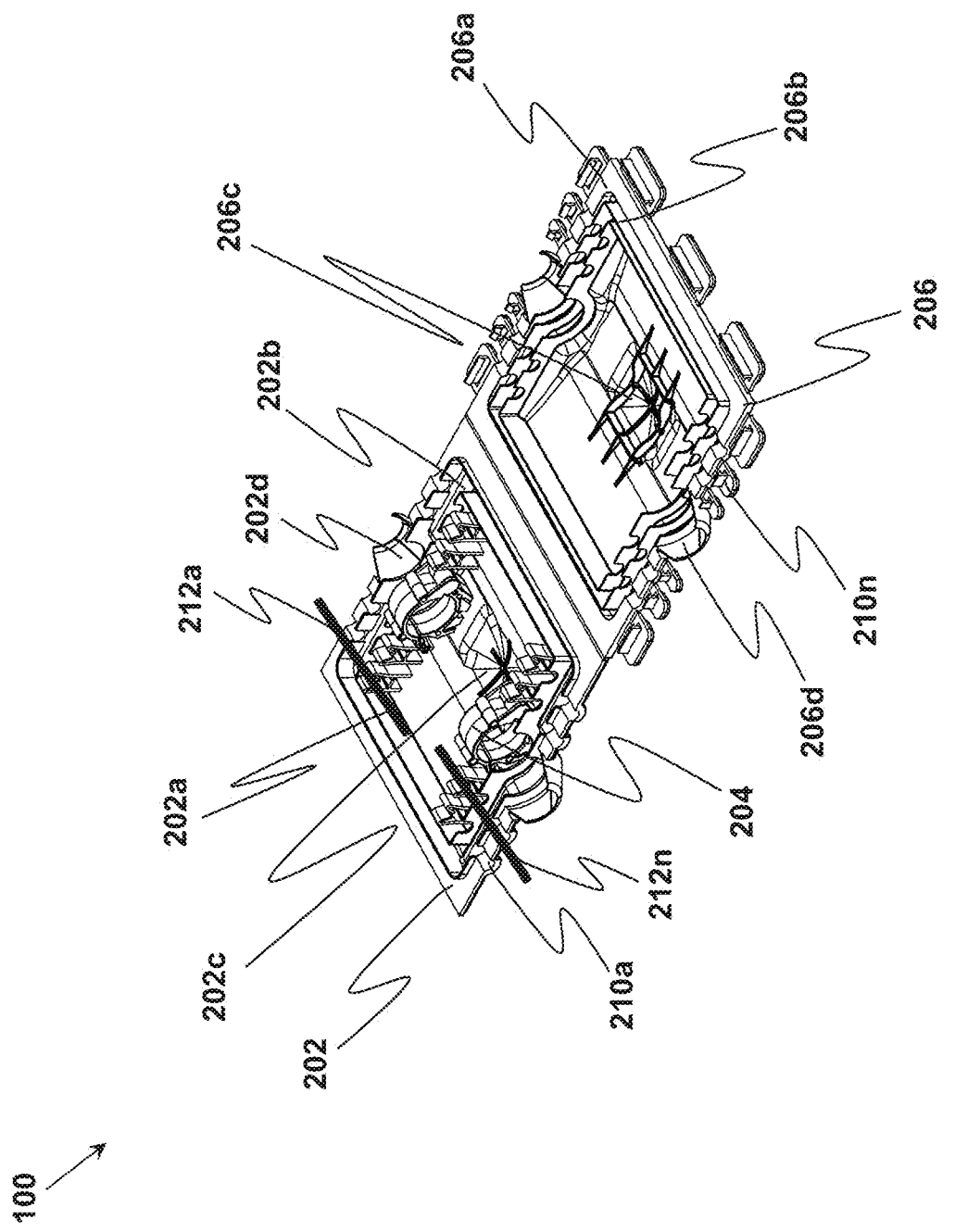
FIG. 2A illustrates a perspective view of the enclosure of FIG. 1A when the enclosure exhibits an open position, in accordance with an embodiment of the present disclosure.

FIG. 2A illustrates a perspective view of the enclosure 100 of FIG. 1A when the enclosure 100 exhibits an open position, in accordance with an embodiment of the present disclosure. The enclosure 100 may include a first cover portion 202, a clamping structure 204, a second cover portion 206, a plurality of clamps 208a-208n (hereinafter collectively referred to and designated as "the clamps 208"), and a plurality of locking elements 210a-210n (hereinafter collectively referred to and designated as "the locking elements 210").

In some embodiments of the present disclosure, the first and second cover portions 202, 206 may include a length that may be in a range of 180 millimetres (mm) to 200 mm. Preferably, the first and second cover portions 202, 206 may include the length that may be 196 mm.

In some embodiments of the present disclosure, the first and second cover portions 202, 206 may include a thickness that may be in a range of 20 mm to 25 mm. Preferably, the first and second cover portions 202, 206 may include the thickness that may be 21.53 mm.

Figure 2B:
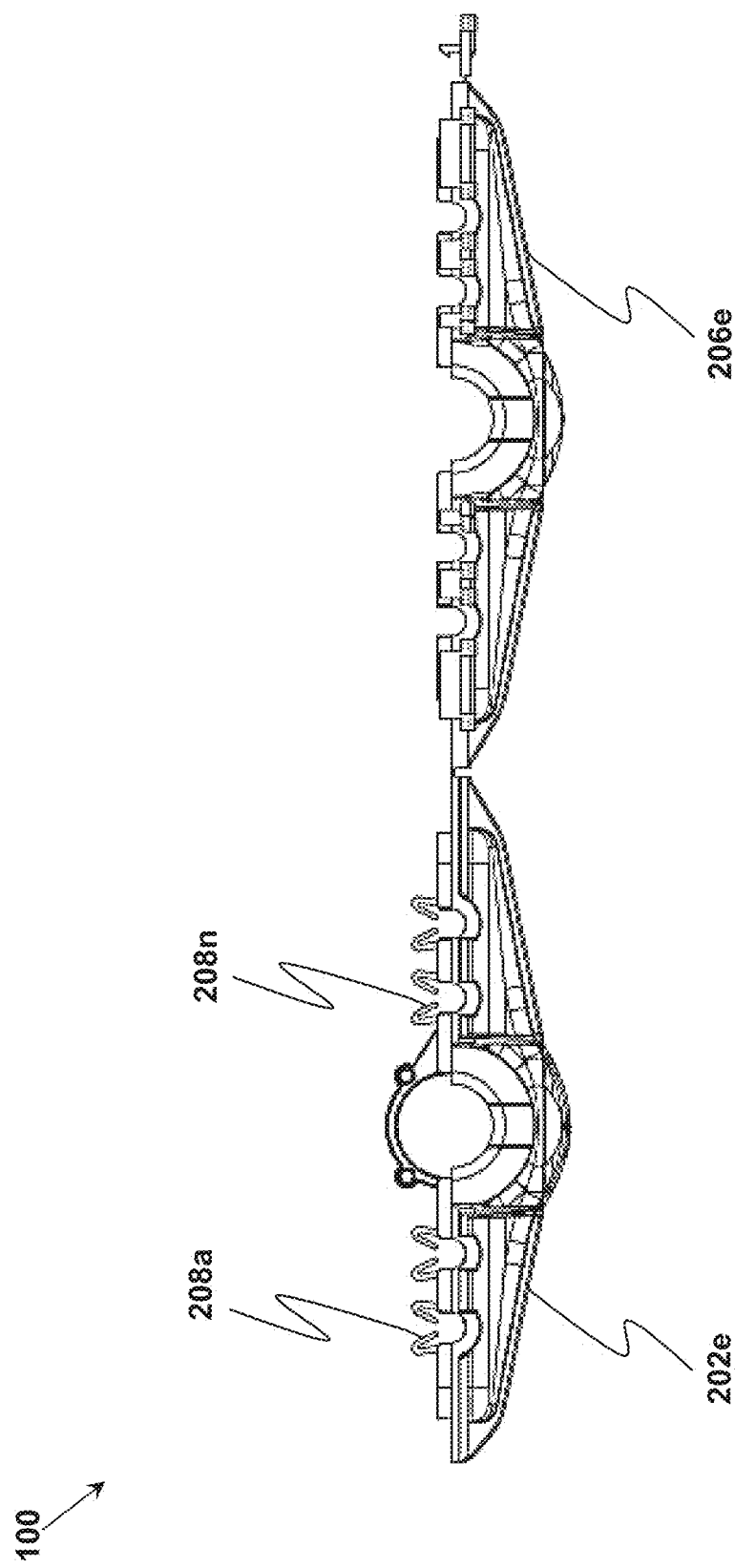
FIG. 2B illustrates a side view of the enclosure of FIG. 1A when the enclosure exhibits the open position, in accordance with an embodiment of the present disclosure.

FIG. 2B illustrates a side view of the enclosure 100 of FIG. 1A when the enclosure 100 exhibits the open position, in accordance with an embodiment of the present disclosure.

The first cover portion 202 may include a first inner surface 202a, a first peripheral groove 202b, a first sunken region 202c, a first sleeve 202d, and a first outer surface 202e. The first peripheral groove 202b may be disposed on the first inner surface 202a. The first peripheral groove 202b may extend along a periphery of the first inner surface 202a.

In some embodiments of the present disclosure, the first sunken region 202c may include a radius of curvature that may be in a range of 35 mm to 40 mm. Preferably, the first sunken region 202c may include the radius of curvature that may be 38.83 mm.

In some embodiments of the present disclosure, the first sleeve 202d may include a width that may be in range of 45 mm to 50 mm. Preferably, the first sleeve 202d may include the width that may be 46.15 mm.

The clamping structure 204 may be disposed on the first inner surface 202a. The clamping structure 204 may be adapted to clamp a plurality of cables 304a-304n (hereinafter collectively referred to and designated as "the cables 304", as shown later in FIG. 3) that may be connected by way of an insulation piercing connector (IPC) 306 (as shown later in FIG. 3).

In some embodiments of the present disclosure, the clamping structure 204 may include a diameter that may be in a range of 35 millimetres (mm) to 40 mm. Preferably, the clamping structure 204 may include the diameter that may be 37.07 mm.

The second cover portion 206 may be hingedly coupled to the first cover portion 202. The second cover portion 206 may include a second inner surface 206a, a second peripheral groove 206b, a second sunken region 206c, a second sleeve 206d, a second outer surface 206e. The second peripheral groove 206b of the second inner surface 206a may be disposed on the second inner surface 206a. The second peripheral groove 206b may extend along a periphery of the second inner surface 206a.

In some embodiments of the present disclosure, the second sunken region 206c may include a radius of curvature that may be in a range of 30 mm to 35 mm. Preferably, the second sunken region 206c may include the radius of curvature that may be 31.40 mm.

In some embodiments of the present disclosure, the second sleeve 206d may include a width that may be in range of 45 mm to 50 mm. Preferably, the second sleeve 206d may include the width that may be 46.15 mm.

The first and second peripheral grooves 202b, 206b may be adapted to receive a gel sealant 302 (as shown later in FIG. 3). Specifically, the first and second peripheral grooves 202b, 206b may be adapted to receive the gel sealant 302 such that the gel sealant 302 facilitates to create an environmental barrier around the enclosure 100. In some exemplary embodiments of the present disclosure, the first and second peripheral grooves 202b, 206b may be adapted to receive the gel sealant 302 such that a gap is formed between the IPC 306 and the gel sealant 302. The gap may advantageously enable a contactless design for the IPC 306 and the gel sealant 302. In some embodiments of the present disclosure, the gel sealant 302 may be one of, a silicone-based gel sealant, a polyurethan gel sealant, an epoxy gel sealant, and an acrylic gel sealant.

The enclosure 100 may exhibit the open position and the closed position. In the open position, an angle between the first cover portion 202 and the second cover portion 206 may be a non-zero angle. In the closed position, the angle between the first cover portion 202 and the second cover portion 206 may be a zero angle. The gel sealant 302 may facilitate to create the environmental barrier when the enclosure 100 exhibits the closed position.

The clamps 208 may be disposed on the first inner surface 202a. The clamps 208 may be adapted to hold a plurality of subsidiary cables 212a-212n.

The first sunken region 202c may be disposed on the first inner surface 202a. The second sunken region 206c may be disposed on the second inner surface 206a. The first and second sunken regions 202c, 206c may facilitate seating of the IPC 306.

The first and second sleeves 202d, 206d may be adapted to facilitate to guide the cables 304. Specifically, the first and second sleeves 202d, 206d may be adapted to facilitate to guide the cables 304 upon insertion of the cables 304 in the enclosure 100 when the enclosure 100 exhibits the closed position.

The locking elements 210 may be coupled to the first and second cover portions 202, 206. Specifically, the locking elements 210 may be coupled to the first and second cover portions 202, 206 such that each locking element of the locking elements 210 may be adapted to lock the first cover portion 202 with the second cover portion 204 when the enclosure 100 exhibits the closed position.

The first and second outer surfaces 202e, 206e may be provided with a plurality of reinforcement structures. The reinforcement structures may facilitate the enclosure 100 to withstand rigorous durable tests. The reinforcement structures may facilitate the enclosure 100 to endure environmental conditions, such as, Ultra-Violet (UV) exposure, temperature fluctuations, and physical impacts, unlike conventional designs that may degrade over time. The reinforcement structures may enhance durability. The reinforcement structures may advantageously facilitate the enclosure 100 to withstand UV radiation, physical impacts, and extreme temperature fluctuations. The reinforcement structures may be designed such that the enclosure 100, when tested under various durability scenarios, has capability to maintain structural integrity in harsh outdoor environments.

The enclosure 100 may exhibit the monolithic structure. In other words, the first cover portion 202, the clamping structure 204, the second cover portion 206, the clamps 208, the locking elements 210 may be integral components of the enclosure 100, thus making the enclosure 100, the monolithic structure.

Figure 3:
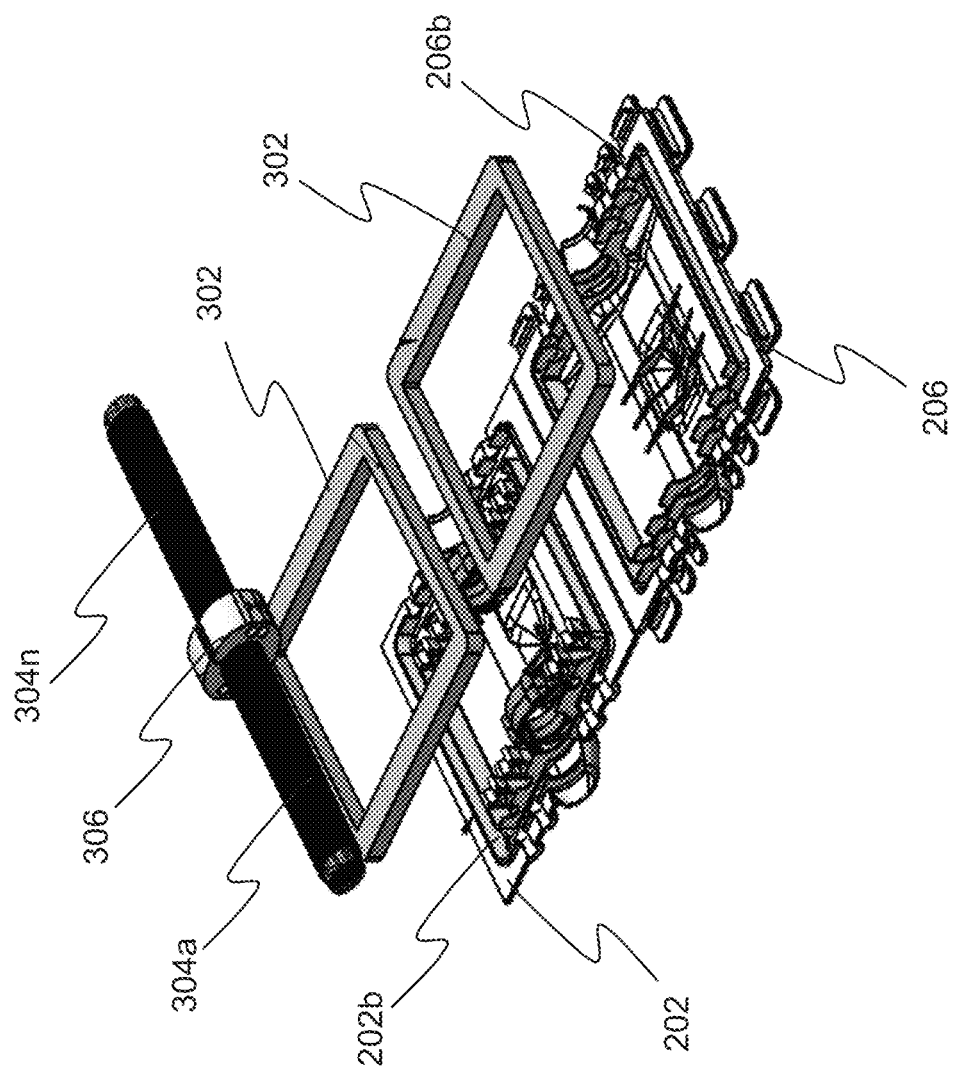
FIG. 3 illustrates a perspective view of the enclosure of FIG. 1A when a gel sealant is applied in the enclosure, in accordance with an embodiment of the present disclosure.

FIG. 3 illustrates a perspective view of the enclosure 100 of FIG. 1 when the gel sealant 302 is applied in the enclosure, in accordance with an embodiment of the present disclosure. FIG. 3 shows that the clamping structure 204 clamps the plurality of cables 304a-304n that is connected by way of an insulation piercing connector (IPC) 306. The gel sealant 302 may be provided in the first and second peripheral grooves 202b, 206b. Specifically, the gel sealant 302 may be provided in the first and second peripheral grooves 202b, 206b such that the gel sealant 302 facilitates to create the environmental barrier around the enclosure 100.

In some embodiments of the present disclosure, the IPC 306 may be 750-500 MCM CIPC connector. Embodiments of the present disclosure are intended to include and/or otherwise cover any type of the connector, without deviating from the scope of the present disclosure.

In some exemplary embodiments of the present disclosure, the enclosure 100 comprises two portions: a first cover portion 202 and a second cover portion 206 hinged together. This hinged configuration enables the enclosure 100 to transition between open and closed positions, facilitating easy access during installation or maintenance. The hinge ensures secure alignment of the two cover portions. Both the first and second peripheral grooves 202b, 206b are designed to receive a gel sealant 302, forming a robust environmental barrier. This barrier prevents ingress of contaminants such as moisture, dust, or debris, ensuring protection of the insulation piercing connector (IPC) 306. The gel sealant 302 is positioned to create a contactless design, avoiding any interference with the IPC's conductive elements. The first cover portion 202 is equipped with a clamping structure 204 to secure multiple cables 304a-304n. This mechanism prevents cable displacement during operation or under external stresses, ensuring stable electrical connections. Subsidiary cables 212a-212n are also accommodated through additional clamps 208a-208n. The first and second cover portions 202, 206 include sunken regions 202c, 206c that facilitate stable seating of the IPC 306. This design ensures proper positioning and alignment of the IPC during operation. The sleeves 202*d*, 206*d* integrated into the first and second cover portions guide the insertion of cables 304*a*-304*n* into the enclosure 100. These sleeves simplify installation and protect the cables from potential wear and tear.

In some exemplary embodiments of the present disclosure, the enablement of the present invention may be as follows:—

1. Easy Installation Process: The hinged design allows installers to open the enclosure 100 at an angle, ensuring easy access for connecting cables 304*a*-304*n* to the IPC 306. The locking elements 210*a*-210*n* secure the enclosure in its closed position, maintaining consistent alignment and sealing integrity.

2. Contactless Gel Design: The peripheral grooves 202*b*, 206*b* hold the gel sealant 302 without direct contact with the IPC 306, minimizing any risk of electrical interference or degradation of the conductive elements.

3. Customizable Dimensions: The clamping structure 204 is designed with a diameter range of 35 mm to 40 mm, making the enclosure 100 suitable for various cable sizes commonly used in solar and electrical installations.

4. Monolithic Structure for High Strength: A monolithic design ensures structural integrity and eliminates weak points, making the enclosure 100 particularly suited for demanding applications where mechanical stability is critical.

In some exemplary embodiments of the present disclosure, the present invention may be deployed in residential rooftop solar installations, the enclosure 100 houses IPCs connecting multiple photovoltaic panels. The gel sealant 302 effectively prevents moisture ingress caused by rain, ensuring the reliability of electrical connections. Additionally, the clamping structure 204 secures cables against high wind loads, enhancing the system's stability. In utility-scale solar fields, the enclosure 100 protects IPCs from harsh environmental factors such as UV radiation, dust storms, and temperature variations. Reinforcement structures on the outer surfaces 202*e*, 206*e* provide added durability, safeguarding the enclosure during equipment handling and operation.

The enclosure 100 is also applicable in industrial outdoor systems beyond solar installations, such as communication towers or street lighting networks. In these environments, it provides robust protection for IPCs against corrosion, mechanical damage, and other external stresses. Its versatility makes it ideal for use in a wide range of outdoor electrical applications that demand long-term reliability and environmental resilience.

Designed for sustainability, the enclosure 100 incorporates reusable materials and mechanisms, making it suitable for temporary setups or frequently repositioned electrical systems. Gel sealants 302 used in the enclosure are composed of high-performance materials, including silicone, polyurethane, epoxy, or acrylic, tailored to withstand specific environmental challenges such as extreme temperatures or prolonged exposure to the elements. Reinforcement structures on the outer surfaces enhance durability, enabling the enclosure 100 to endure demanding conditions like UV exposure and high physical impacts.

In some exemplary embodiments of the present disclosure, the OEC enclosure 100 combines three key elements to deliver effective protection and ease of use for solar installations. Each component is meticulously designed to address common challenges in maintaining electrical connections in outdoor environments. Gel-Sealed Perimeter: The perimeter of the enclosure 100 is engineered specifically for gel sealant 302 application, forming a robust environmental barrier that shields electrical connections from contaminants such as moisture, dust, and debris. This design eliminates direct contact between the gel sealant 302 and the IPC 306, ensuring the conductive elements remain untouched and performance is unaffected. Cable Locking Mechanism: A secure cable-locking system is integral to the design, preventing cable movement or displacement that could cause stress or damage over time. This mechanism also simplifies installation by facilitating the straightforward placement of the IPC 306 within the enclosure 100, reducing complexity and minimizing errors. Reinforced Top Section: The top section of the enclosure 100 is structurally reinforced to provide enhanced durability. This ensures that the enclosure 100 withstands UV radiation, extreme temperatures, and physical impacts. Rigorous durability testing demonstrates the system's ability to maintain structural integrity in demanding outdoor conditions. Comprehensive Environmental Protection: By integrating the gel sealant 302-sealed perimeter, cable locking mechanism, and reinforced top, the system provides comprehensive protection against environmental stresses. These features work together to create a reliable solution that ensures the stability and performance of electrical connections over time. Practical Application: In large-scale solar installations, the enclosure 100 secures electrical connections between photovoltaic panels. The gel sealant 302-sealed perimeter effectively blocks moisture ingress, the locking mechanism stabilizes cables during operation, and the reinforced top protects against physical impacts, ensuring long-lasting reliability. The OEC enclosure 100 is an innovative solution tailored for the rigorous demands of outdoor solar environments. Its unique combination of gel sealant 302 sealing, cable locking, and structural reinforcement simplifies installation, enhances durability, and ensures optimal performance, making it an essential component for reliable solar installations.

In an exemplary embodiment, the clamping structure (204) is disposed on the first inner surface (202*a*). The clamping structure (204) adapted to clamp a plurality of cables (304*a*-304*n*) that are connected by way of the IPC (306). When the first cover portion (202) and the second cover portion (206) are connected to each other through the gel sealant (302) to form the enclosure (100), the clamping structure (204) is accommodated inside the enclosure (100).

Thus, the innovative design of the connector enclosure 100 system offers several key advantages. The gel-sealed perimeter creates a robust barrier that protects electrical connections from contaminants and moisture, ensuring their long-term integrity. The system's locking mechanism simplifies installation by securing cables firmly in place and facilitating straightforward IPC 306 placement, thereby saving time and reducing installation errors. Additionally, the reinforced top section enhances the enclosure 100's durability, enabling it to withstand challenging environmental conditions such as extreme temperatures, physical impacts, and UV exposure. Together, these features contribute to the system's long-term reliability, minimizing maintenance needs and improving overall performance in solar installations. This connector enclosure 100 system is highly versatile and suited for a wide range of solar energy applications, including residential, commercial, and utility-scale installations. Its robust environmental protection and durability make it particularly valuable for outdoor electrical connections exposed to harsh conditions. Beyond solar energy, the system can also be applied in other industries requiring reliable, long-lasting protection for electrical connections in outdoor environments. By combining enhanced environmental protection, simplified installation, and improved durability, the connector enclosure 100 system represents a significant advancement in protecting electrical connections in solar and other outdoor applications. Its unique design ensures efficiency, reliability, and longevity, making it an indispensable component for sustainable energy and electrical systems.

The foregoing discussion of the present disclosure has been presented for purposes of illustration and description. It is not intended to limit the present disclosure to the form or forms disclosed herein. In the foregoing Detailed Description, for example, various features of the present disclosure are grouped together in one or more aspects, configurations, or aspects for the purpose of streamlining the disclosure. The features of the aspects, configurations, or aspects may be combined in alternate aspects, configurations, or aspects other than those discussed above. This method of disclosure is not to be interpreted as reflecting an intention the present disclosure requires more features than are expressly recited in each claim. Rather, as the following claims reflect, inventive aspects lie in less than all features of a single foregoing disclosed aspect, configuration, or aspect. Thus, the following claims are hereby incorporated into this Detailed Description, with each claim standing on its own as a separate aspect of the present disclosure.

Moreover, though the description of the present disclosure has included description of one or more aspects, configurations, or aspects and certain variations and modifications, other variations, combinations, and modifications are within the scope of the present disclosure, e.g., as may be within the skill and knowledge of those in the art, after understanding the present disclosure. It is intended to obtain rights which include alternative aspects, configurations, or aspects to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

I claim:

1. An enclosure (100) for insulation piercing connector (IPC) (306), the enclosure (100) comprising:
    a first cover portion (202) comprising:
        a first inner surface (202a);
        a first peripheral groove (202b) that is disposed on the first inner surface (202a) and extends along a periphery of the first inner surface (202a), the first peripheral groove being adapted to receive a gel sealant (302);
        a first sleeve (202d) extending inward from the first inner surface (202a) to guide insertion of a plurality of cables (304a-304n);
        a first sunken region (202c) centrally formed in the first inner surface (202a) to seat the IPC (306); and
    a second cover portion (206) hingedly coupled to the first cover portion (202), the second cover portion (206) comprising:
        a second inner surface (206a); and
        a second peripheral groove (206b) that is disposed on the second inner surface (206a) and extends along a periphery of the second inner surface (206a), the second peripheral groove connectable with the first peripheral groove (202b) to form a continuous channel for the gel sealant (302)
        a second sleeve (206d) extending inward from the second inner surface (206a) to guide insertion of the plurality of cables (304a-304n);
        a second sunken region (206c) centrally formed in the second inner surface (206a) to seat the IPC (306); and
    wherein, when the first and second cover portions (202, 206) are brought from a non-zero angle to a zero-hinge angle to form the enclosure, the gel sealant (302) creates both a contactless environmental barrier around the IPC and the plurality of cables (304a-304n) and a primary latching force holding the two halves together;
    a clamping structure (204) disposed on the first inner surface (202a), and the clamping structure (204) adapted to clamp a plurality of cables (304a-304n) that are connected by way of the IPC (306) such that when the first cover portion (202) and the second cover portion (206) are connected to each other through the gel sealant (302) to form the enclosure (100), the clamping structure (204) is accommodated inside the enclosure (100).

2. The enclosure (100) as claimed in claim 1, further comprising a plurality of locking elements (210a-210n) that are coupled to the first and second cover portions (202, 206) such that each locking element of the plurality of locking elements (210a-210n) is adapted to lock the first cover portion (202) with the second cover portion (206) when the enclosure (100) exhibits the closed position to provide secondary mechanical retention for the enclosure.

3. The enclosure (100) as claimed in claim 1, further comprising a plurality of clamps (208a-208n) disposed on the first inner surface (202a) and adapted to hold a plurality of subsidiary cables (212a-212n).

4. The enclosure (100) as claimed in claim 1, wherein the first and second peripheral grooves (202b, 206b) are adapted to receive the gel sealant (302) such that a gap is formed between the IPC (306) and the gel sealant (302), wherein the gap enables a contactless design for the IPC (306) and the gel sealant (302).

5. The enclosure (100) as claimed in claim 1, wherein the first cover portion (202) comprising a first outer surface (202e) and a second cover portion (206) comprising a second outer surface (206e) such that the first and second outer surfaces (202e, 206e) are provided with a plurality of reinforcement structures.

6. The enclosure (100) as claimed in claim 1, wherein the gel sealant (302) comprising one of, a silicone-based gel sealant, a polyurethane gel sealant, an epoxy gel sealant, and an acrylic gel sealant.

7. The enclosure (100) as claimed in claim 1, wherein the enclosure (100) is a reusable enclosure.

8. The enclosure (100) as claimed in claim 1, wherein the enclosure (100) exhibits a monolithic structure.

9. The enclosure (100) as claimed in claim 1, wherein the clamping structure (204) comprising a diameter that is in a range of 35 millimetres (mm) to 40 mm.

* * * * *